United States Patent [19]

Matsumoto

[11] Patent Number: 4,866,297
[45] Date of Patent: Sep. 12, 1989

[54] PROCESSING CIRCUIT FOR USE WITH DC-VOLTAGE-OUTPUT TYPE SENSORS

[75] Inventor: Naoyuki Matsumoto, Kyoto, Japan

[73] Assignee: Horiba, Ltd., Minami, Japan

[21] Appl. No.: 81,731

[22] Filed: Aug. 5, 1987

[30] Foreign Application Priority Data

Aug. 23, 1986 [JP] Japan .............................. 61-128485[U]

[51] Int. Cl.[4] ......................... H03K 5/22; H03K 17/56
[52] U.S. Cl. .................................... 307/236; 307/262; 307/240; 307/491
[58] Field of Search ............... 307/243, 236, 262, 490, 307/240, 491

[56] References Cited

U.S. PATENT DOCUMENTS 3,624,414 11/1971 Van Dijk ............................ 307/236
3,947,699 3/1976 Whitmer .............................. 307/236
4,068,138 1/1978 Miyakawa et al. .................. 307/236
4,354,235 10/1982 Blakeslee ............................. 307/236

FOREIGN PATENT DOCUMENTS 0723601 3/1980 U.S.S.R. .

Primary Examiner—Stanley D. Miller
Assistant Examiner—Richard Roseen
Attorney, Agent, or Firm—Wenderoth, Lind & Ponack

[57] ABSTRACT

A processing circuit for use with DC-voltage-output type sensors comprising: a preamplifier; an automatic polarity-switching means coupled to the sensor and the preamplifier for switching the connection condition between a non-polarity-inversion condition and a polarity-inversion condition; and a controlling-measuring means for controlling the automatic polarity-switching means in carrying out the switching alternately between the non-polarity-inversion condition and the polarity-inversion condition, and for measuring the difference between the output of the preamplifier under the non-polarity-inversion condition and the output of the preamplifier under the polarity-inversion condition, thereby cancelling the effects of the input offset voltage of the preamplifier and the offset voltage of the preamplifier and the offset voltage generated by the input bias current and the resistance of said DC-voltage-output type sensor.

3 Claims, 2 Drawing Sheets

PROCESSING CIRCUIT FOR USE WITH DC-VOLTAGE-OUTPUT TYPE SENSORS

BACKGROUND OF THE INVENTION

1. Field of the Invention

The present invention relates to an improved processing circuit in which DC-voltage-output type sensors, such as thermocouples and thermopiles, are connected.

2. Description of the Prior Art

Generally, in a radiation thermometer using a thermopile, a processing circuit, as shown in FIG. 4, is adapted to cancel an input offset voltage at a preamplifier A by connecting a switch sw in parallel with a thermopile S (DC-voltage-output type sensor) which is connected to the preamplifier A. The switch is automatically ON/OFF controlled by a controlling means measuring C.

However, there are two kinds of offset voltage at the preamplifier A, that is, an input offset voltage and an offset voltage generated by an input bias current $I_B$ and a resistance $r_s$ of the thermopile S. In a processing circuit having the above described conventional construction, the former input offset voltage can be cancelled, but the latter offset voltage generated by the input bias current $I_B$ and resistance $r_s$ of the thermopile S cannot be cancelled. As a result, a problem exists in that a highly accurate measurement cannot be attained.

In order to reduce the influences caused by the offset voltage generated by the input bias current $I_B$ and the resistance $r_s$ of the thermopile S, the use of high-grade amplifiers, such as MOS-TOP type amplifiers, for preamplifier A has been considered. However, the amplifiers of this type generally produce a large amount of noise, creating a disadvantage in that it becomes very difficult to measure a minute voltage such as the output of the thermopile S. Additionally, productions cost are increased.

SUMMARY OF THE INVENTION

The present invention was achieved in view of the above described problem. It is an object of the present invention to provide a processing circuit for use with a DC-voltage-output type sensor capable of cancelling not only an input offset voltage in a preamplifier but also an offset voltage generated by an input bias current and a resistance of a DC-voltage-output type sensor, whereby a highly accurate measurement can be achieved, by the application of a very simple and economical improvement in construction.

In order to achieve the above described object, a processing circuit for use with DC-voltage-output type sensors according to the present invention includes: a preamplifier provided for a DC-voltage-output type sensor; an automatic polarity-switching means provided between the sensor and the preamplifier for switching over the connection condition thereof between a non-polarity-inversion condition and a polarity-inversion condition; and a controlling-measuring means for controlling said automatic polarity-switching means to alternately carry out said non-polarity-inversion condition and said polarity-inversion-condition, and for taking a difference between an output of the preamplifier under the non-polarity-inversion condition and an output of the preamplifier under the polarity-inversion condition, whereby not only is an input offset voltage of said preamplifier cancelled, but an offset voltage generated by an input bias current and a resistance of said DC-voltage-output type sensor can also be cancelled.

In a processing circuit for use in a DC-voltage-output type sensor according to the present invention, as is apparent from the description of the preferred embodiments which follows, by merely applying a very simple and economical improvement in the construction of a circuit that provides for automatic polarity-switching means for switching over the connection condition of the DC-voltage-output type sensor and the preamplifier between a non-polarity-inversion condition and a polarity-inversion condition, both the input offset voltage of the preamplifier and the offset voltage generated by the input bias current and the resistance of the DC-voltage-output type sensor can be effectively cancelled. As a result, a highly accurate measurement can always be achieved.

BRIEF DESCRIPTION OF THE DRAWINGS

The preferred embodiments of the processing circuit for use with voltage-output type sensors according to the present invention are shown in FIGS. 1 to 2, in which.

DESCRIPTION OF THE PREFERRED EMBODIMENTS

The preferred embodiments of the present invention will be below described with reference to FIGS. 1 to 2.

Figure 1:
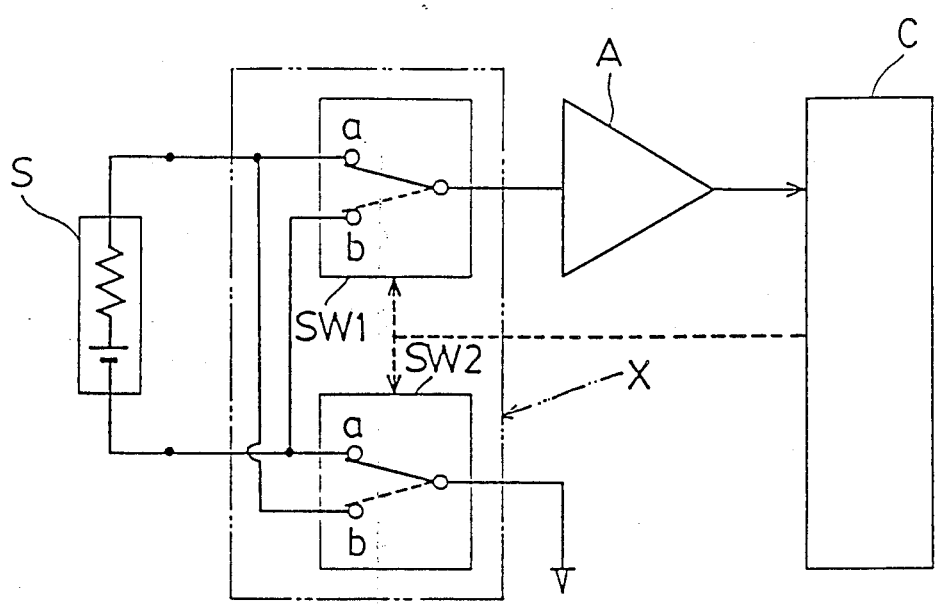
FIG. 1 is a block diagram of a radiation thermometer in which a thermopile, which is one example of a voltage-output type sensor, is used.

Referring now to FIG. 1, which is a block diagram showing a radiation thermometer comprising a thermopile, which is one example of a DC-voltage-output type sensor. The voltage-output type sensor (thermopile) S is connected to a processing circuit for use with voltage-output type sensors according to the present invention.

The processing circuit for use with DC-voltage-output type sensors comprises an automatic polarity-switching means X provided between the thermopile S and the preamplifier A, and a controlling-measuring means C (composed mainly of a CPU, an A/D converter, a D/A converter, etc.) provided at the output of the preamplifier A.

In this embodiment, the automatic polarity switching means X is composed of two highly responsive analog switches SW1 and SW2.

The controlling-measuring means C is adapted to control said automatic polarity switching means X (SW1 and SW2) and to operate the outputs of the preamplifier A as described in detail hereinafter.

That is to say, the analog switches SW1 and SW2 are alternately and automatically switched over to a non-polarity-inversion side terminal (a) and a polarity-inversion side terminal (b) every time appointed by the controlling-measuring means C.

Figure 2A:
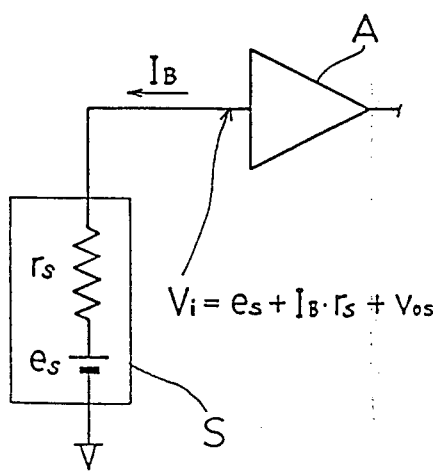
FIGS. 2(A) and 2(B) are schematic diagrams showing the principal parts of a switch circuit for explaining the operation.

Accordingly, in the case where both of the analog switches SW1 and SW2 are switched over to their non-polarity-inversion side terminal (a), the connection condition of the thermopile S and the preamplifier A is the non-polarity-inversion condition as schematically shown in FIG. 2(A). In this condition, if input bias current of the preamplifier A is $I_B$, the input offset voltage $v_{os}$, the electromotive force of the thermopile S $e_s$, and the resistance (an output impedance) $r_s$, the input voltage $V_i$ to the preamplifier A is expressed by the following equation (1):

$$V_i = e_s + I_B \cdot r_s + v_{os} \quad (1).$$

Accordingly, if the amplifying factor of the preamplifier A is $\alpha$, the voltage $V_1$, which is the output from the preamplifier A fed to the controlling-measuring means C, is expressed by the following equation (2):

$$V_1 = \alpha(e_s + I_B \cdot r_s + v_{os}) \quad (2).$$

Figure 2B:
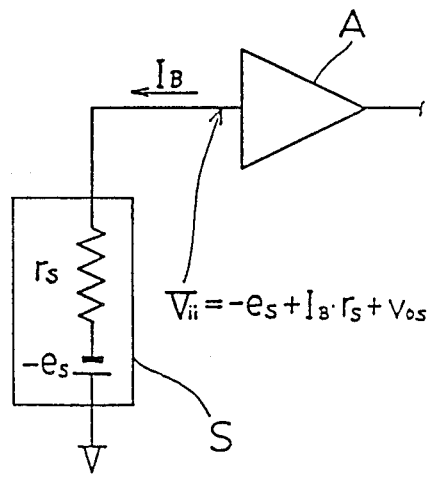
Figure 3:
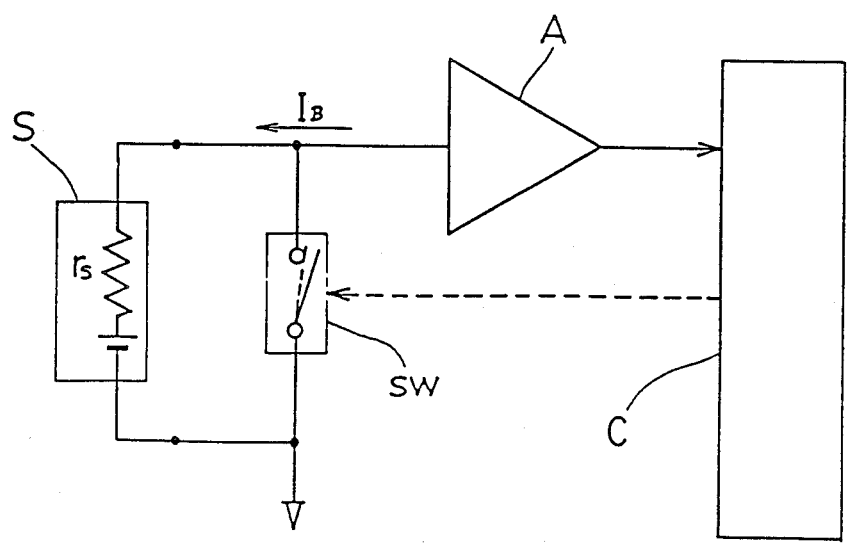
FIG. 3 is a block diagram showing a radiation thermometer in which a thermopile of conventional construction is used.

On the other hand, in the case where both of the analog switches SW1 and SW2 are switched over to their polarity inversion terminal (b), the connection condition of the thermopile S and the preamplifier A is the polarity inversion condition, as schematically shown in FIG. 2(B). In this condition time, an input voltage $V_{ii}$ to the preamplifier A is expressed by the following equation (3):

$$V_{ii} = -e_s + I_B \cdot r_s + v_{os} \quad (3).$$

Accordingly, a voltage $V_{11}$, which is the output from the preamplifier A and fed to the controlling-measuring means C, is expressed by the following equation (4):

$$V_{11} = \alpha(-e_s + I_B \cdot r_s + v_{os}) \quad (4).$$

In the controlling-measuring means C, the difference between the equation (2) value and the equation (4) value, that is to say:

$$\begin{aligned} V_1 - V_{11} &= \alpha(e_s + I_B \cdot r_s + v_{os}) - \\ &\quad \alpha(-e_s + I_B \cdot r_s + v_{os}) \\ &= 2\alpha e_s \end{aligned}$$

is calculated. As a result, both the input offset voltage $v_{os}$ of the preamplifier A and the offset voltage $I_B \cdot r_s$ generated by the input bias current $I_B$ and the resistance $r_s$ of the thermopile S are cancelled. Therefore, a highly accurate measured value of $2\alpha e_s$, which is responsive only to the electromotive force $e_s$ of the thermopile S, is obtained.

Incidentally, it is of course possible to use a standard C-MOS type analog switch (an assembly of ON/OFF analog switch elements) as the automatic polarity-switching means X instead of the two analog switches SW1 and SW2.

As is apparent from the above description, with a processing circuit for use with voltage-output type sensors according to the present invention, both an input offset voltage of a preamplifier and an offset voltage generated by an input bias current and a resistance of a voltage-output type sensor can be satisfactorily cancelled Therefore, a highly accurate measurement can be always attained, by taking the difference between the detected value under the non-inversion condition and the detected value under the inversion condition.

I claim:

1. A processing circuit for use with a DC-voltage-output type sensor, comprising:
    a preamplifier;
    an automatic polarity-switching means coupled to said sensor and said preamplifier for switching a polarity condition of said preamplifier between a non-polarity-inversion condition and a polarity-inversion condition; and
    a controlling-measuring means for controlling said automatic polarity-switching means wherein said automatic polarity-switching means alternately switches between said non-polarity-inversion condition and said polarity-inversion condition, and for measuring a difference between an output of said preamplifier under said non-polarity-inversion condition and an output of said preamplifier under said polarity-inversion condition,
    thereby cancelling the effects of an input offset voltage of said preamplifier and an offset voltage generated by an input bias current and a resistance of said DC-voltage-output type sensor.

2. A processing circuit for use with a DC-voltage-output type sensor as set forth in claim 1, wherein as said automatic polarity-switching means comprises two analog switches.

3. A processing circuit for use with a DC-voltage-output type sensor as set forth in claim 1, wherein said automatic polarity-switching means comprises a C-MOS type analog switch.

* * * * *